(12) United States Patent
Coumou et al.

(10) Patent No.: US 6,707,255 B2
(45) Date of Patent: Mar. 16, 2004

(54) MULTIRATE PROCESSING FOR METROLOGY OF PLASMA RF SOURCE

(75) Inventors: David J. Coumou, Webster, NY (US); Michael L. Kirk, Bloomfield, NY (US)

(73) Assignee: ENI Technology, Inc., Rochester, NY (US)

( * ) Notice: Subject to any disclaimer, the term of this patent is extended or adjusted under 35 U.S.C. 154(b) by 0 days.

(21) Appl. No.: 10/192,196

(22) Filed: Jul. 10, 2002

(65) Prior Publication Data

US 2004/0007984 A1 Jan. 15, 2004

(51) Int. Cl.[7] .............................. B07C 17/00; H05H 1/24
(52) U.S. Cl. .............................. 315/111.41; 315/111.21; 364/478.08
(58) Field of Search ..................... 315/111.21, 111.41, 315/111.51; 324/464, 520; 219/121.43, 121.54; 118/723 I, 723 R; 364/478.08, 478.28

(56) References Cited

U.S. PATENT DOCUMENTS

| | | | |
|---|---|---|---|
| 5,175,472 A | 12/1992 | Johnson, Jr. et al. ... | 315/111.21 |
| 5,565,737 A | 10/1996 | Keane ................... | 315/111.21 |
| 5,705,931 A | 1/1998 | Klick .................... | 324/464 |
| 5,971,591 A * | 10/1999 | Vona et al. ............. | 364/478.08 |
| 6,046,594 A | 4/2000 | Mavretic ................ | 324/520 |
| 6,509,542 B1 * | 1/2003 | Benjamin et al. ...... | 219/121.43 |

OTHER PUBLICATIONS

WIPO Publication No. WO 01/08288.

* cited by examiner

*Primary Examiner*—James Clinger
(74) *Attorney, Agent, or Firm*—Harness, Dickey & Pierce, P.L.C.

(57) ABSTRACT

An RF generator is provided for use in an RF plasma system. The RF generator includes: a power source that is operable to generate RF power signals at a tuned frequency; a sensor unit that is adapted to detect the RF power signals and operable to generate analog signals representative of the RF power signals, where the analog signals include a frequency of interest and a plurality of interfering frequency components; and a sensor signal processing unit that is adapted to receive the analog signals from the sensor unit and to band limit the analog signals within a predefined bandwidth that passes the frequency of interest and rejects interfering frequency components.

22 Claims, 5 Drawing Sheets

MULTIRATE PROCESSING FOR METROLOGY OF PLASMA RF SOURCE

FIELD OF THE INVENTION

The present invention relates generally to RF plasma systems which employ frequency tunable sources and, more particularly, to a multirate signal processing technique that tracks the tuned frequency of an RF generator and effectively removes undesirable frequency components.

BACKGROUND OF THE INVENTION

In the semiconductor industry, plasma etching has become an integral part of the manufacture of semiconductor circuits. In fact, etchers are frequently used in semiconductor processing when a relatively straight vertical edge is needed. For instance, when etching the polysilicon gate of a MOS transistor, undercutting the polysilicon can adversely affect the operation of the transistor. Undercutting is frequently encountered when a liquid etching method is used. As a result, other etching techniques such as plasma etching have evolved. Plasma etching, which uses ions accelerated by an electric field, tends to etch only horizontal exposed surfaces and therefore avoids undercutting.

In order to effectively execute a plasma etching process (as well as any other plasma process), it is highly desirable to precisely control the power delivered to the plasma chamber. Strict requirements to control the power have evolved as the complexity of the etching process increases. Consequently, various control techniques are employed to monitor the power actually being delivered to the plasma chamber.

Conventional control approaches have been unable to meet the increasingly strict tolerance requirements of the plasma process for a number of reasons. One particular reason is that the RF power delivered to a plasma chamber typically includes multiple fundamental frequencies as well as corresponding harmonic tones. For instance, the voltage applied to the plasma chamber may have fundamental frequencies at both 2 MHz and 27 MHz, where the 2 MHz signal includes harmonics at 4 MHz, 6 MHz, 8 MHz, etc. In addition, the 27 MHz signal may include intermodulation products at 25 MHz, 23 MHz, etc. This is significant because the knowledge of the amount of energy delivered by the source(s) may be distorted by harmonic tones or intermodulation products thus requiring the limitation or elimination of these frequencies for an accurate measurement. Multirate processing possess significant processing gain to significantly reduce the undesirable frequency components. Processing gain is the rejection of out of band noise. This occurs when the frequency of interest occupies less bandwidth than the input signal.

The present invention provides a multirate signal processing technique that tracks the tuned frequency of an RF generator, thereby effectively removing undesirable frequency components from the frequency of interest. This approach significantly relaxes the design specifications of any filtering elements between the sensor and signal processing unit. This approach also has the immediate benefit of improved accuracy and a reduced footprint. This approach is also adaptable to a variety of RF sensors.

The present invention is also significant with regard to RF plasma systems employing frequency tunable sources. A RF generator in a frequency tunable system adjusts its frequency to maximize power transfer. When the frequency is adjusted, the bandpass region of the metrology also has to shift accordingly for the tuned frequency to pass the frequency of interest and remove the others. The present invention coherently tracks the tune frequency of the RF generator.

An additional benefit from the present invention is realized in plasma systems that utilize multiple RF frequency sources. It is often the case in multiple RF frequency sources that intermodulation products exist in the frequency band of the metrology circuit. This will result when the metrology of the high frequency RF source bandwidth is greater than the intermodulation product of the frequency sources. A multirate processing scheme provides significant attenuation to out of band signals to eliminate the effect of these intermodulation products on the accuracy of the metrology.

SUMMARY OF THE INVENTION

In accordance with the present invention, an RF generator is provided for use in an RF plasma system. The RF generator includes: a power source that is operable to generate RF power signals at a tuned frequency; a sensor unit that is adapted to detect the RF power signals and operable to generate analog signals representative of the RF power signals, where the analog signals include a frequency of interest and a plurality of interfering frequency components; and a sensor signal processing unit that is adapted to receive the analog signals from the sensor unit and to band limit the analog signals within a predefined bandwidth that passes the frequency of interest and rejects interfering frequency components. The sensor signal processing unit is preferably implemented in the digital domain.

For a more complete understanding of the invention, its objects and advantages, reference may be had to the following specification and to the accompanying drawings.

DETAILED DESCRIPTION OF THE PREFERRED EMBODIMENTS

Figure 1:
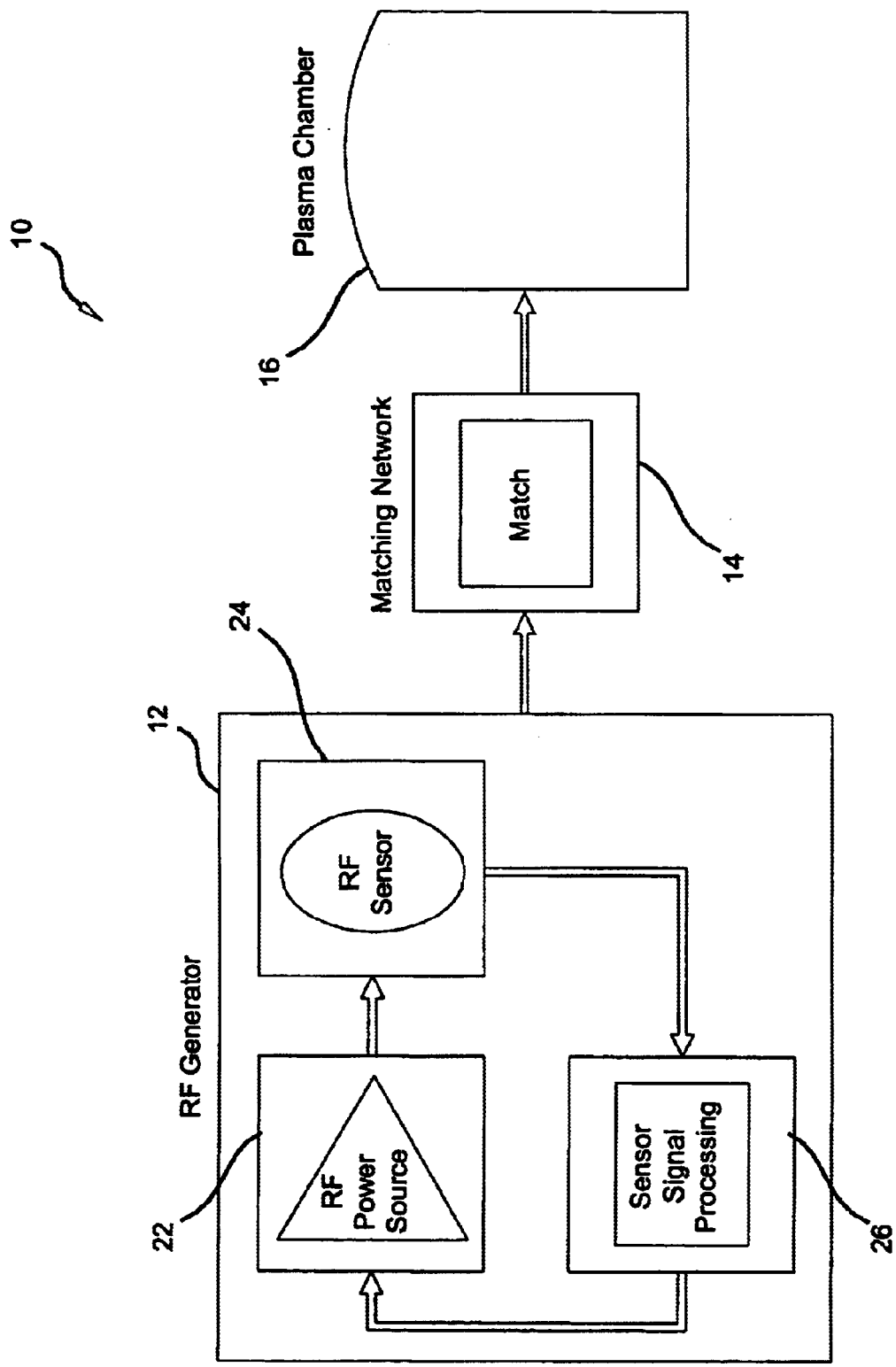
FIG. 1 is a diagram of an exemplary single source RF plasma system.

An exemplary single source RF plasma system 10 is depicted in FIG. 1. The RF plasma system 10 is comprised of an RF generator 12, a matching network 14 and a plasma chamber 16 as is well known in the art. While the following description is provided with reference to a single source system, it is readily understood that the broader aspects of the present invention are applicable to RF plasma systems having two or more RF generators.

The RF generator 12 further includes an RF power source 22, an RF sensor 24 and a sensor signal processing unit 26. In operation, the RF power source 22 is operable to generate RF power signals that are output via the matching network 14 to the plasma chamber 16. It is to be understood that only the primary components of generator are discussed, but that other known components are needed to implement the generator.

An RF sensor 24 is interposed between the RF power source 22 and the matching network to detect the RF power signals output by the RF power source 22. The RF sensor 24 is generally operable to generate analog signals representative of the RF power signals which are in turn used as control signals to the RF power source 22. In one exemplary embodiment, the RF sensor 24 is comprised of a voltage probe and a current probe, such that the sensor outputs represent RF line voltage and RF line current, respectively. In an alternative embodiment, the RF sensor may be defined as a directional sensor whose outputs correspond to forward power and reflected power. In either case, two output signals from the RF sensor 24 preferably serve as input to the sensor signal processing unit 26. The sensor output is connected via a 50-Ohm transmission line to the sensor signal processing unit 26. Transmission line selection is arbitrary provided the following principles are adhered to: good waveform fidelity is maintained through careful impedance matching of the line and the termination, and good attenuation of interfering signals is maintained through proper shielding and construction that rejects external electromagnetic interference. Although sensor signal processing is somewhat dependent on the particular sensor configuration, it is readily understood that the broader aspects of the sensor signal processing approach of the present invention is applicable to different types of sensor configurations.

In accordance with the present invention, the sensor signal processing unit 26 is adapted to receive analog signals from the RF sensor and output a digital control signal that tracks the tuned frequency of the RF power signals generated by the RF power source 22. It is understood that the analog signals received from the RF sensor will include a frequency of interest and a plurality of interfering frequency components or other unwanted spurious frequency components. In operation, the sensor signal processing unit 26 band limits the analog signals within a predefined bandwidth that passes the frequency of interest and rejects the interfering frequency components. Although the frequency of interest is preferably the fundamental frequency component at the tuned frequency of the power, it is envisioned that the frequency of interest may also include other frequency components that are related to the tuned frequency. In the case of a tunable RF power source, the predefined bandwidth is adjustable to pass the frequency of interest as will be further described below. It is envisioned that the sensor signal processing unit 26 may be local or remotely located from the RF sensor 24.

Figure 2:
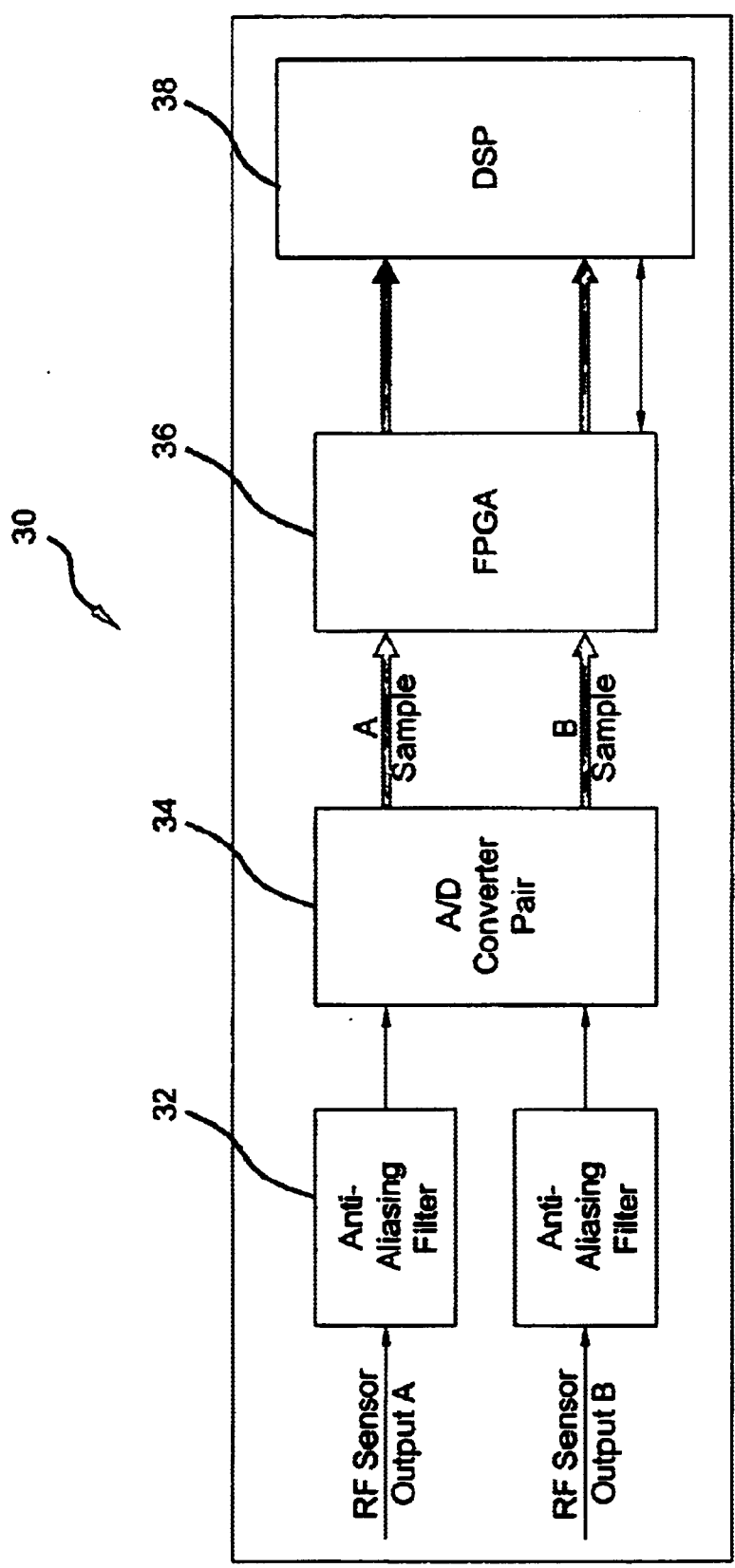
FIG. 2 is a diagram of an exemplary hardware architecture for a sensor signal processing unit in accordance with the present invention.

Referring to FIG. 2, an exemplary hardware architecture 30 is illustrated for implementing the sensor processing unit 26. Each sensor output is initially filtered by an anti-aliasing filter 32. The purpose of the anti-aliasing filters is to band limit the frequency of the signal of interest. The minimum bandwidth of the filter is typically equivalent to the operating frequency band of the RF power source. Attenuation of the sensor output signals prior to the filter may be necessary depending on the amplitude of the output signals; otherwise, the design specifications for these anti-aliasing filters 32 are not critical because further band limiting is accomplished during the decimation process.

Each anti-aliasing filter 32 is in turn connected to a high-speed analog-to-digital (A/D) converter pair 34. The A/D converters 34 operate as a pair by simultaneously sampling the respective signal output from each filter. The A/D converter pair 34 then converts the analog input signals into corresponding digital power signals. The spectral content of the input signals includes frequencies in the passband of the anti-aliasing filter that are within the Nyquist range (½ sample rate) or greater. This is achievable because the bandwidth of the converters is greater than the sample rate.

Output from the A/D converter pair 34 is then connected to a programmable device for large scale integration. (LSI). In one exemplary embodiment, a field programmable gate array (FPGA) 36 receives the digital signals output by the A/D converter pair 34. The primary purpose of the FPGA 36 is to reduce the sample rate of the A/D converter pair 34 to a data rate manageable by a digital signal processor 38. It is critical that the signal processing unit does not introduce significant group delay in the control loop of the plasma RF generator. Therefore, the basis of the decimation factor is to provide optimal group delay for the control loop and adequate band limiting for sensor measurement accuracy.

Figure 3:
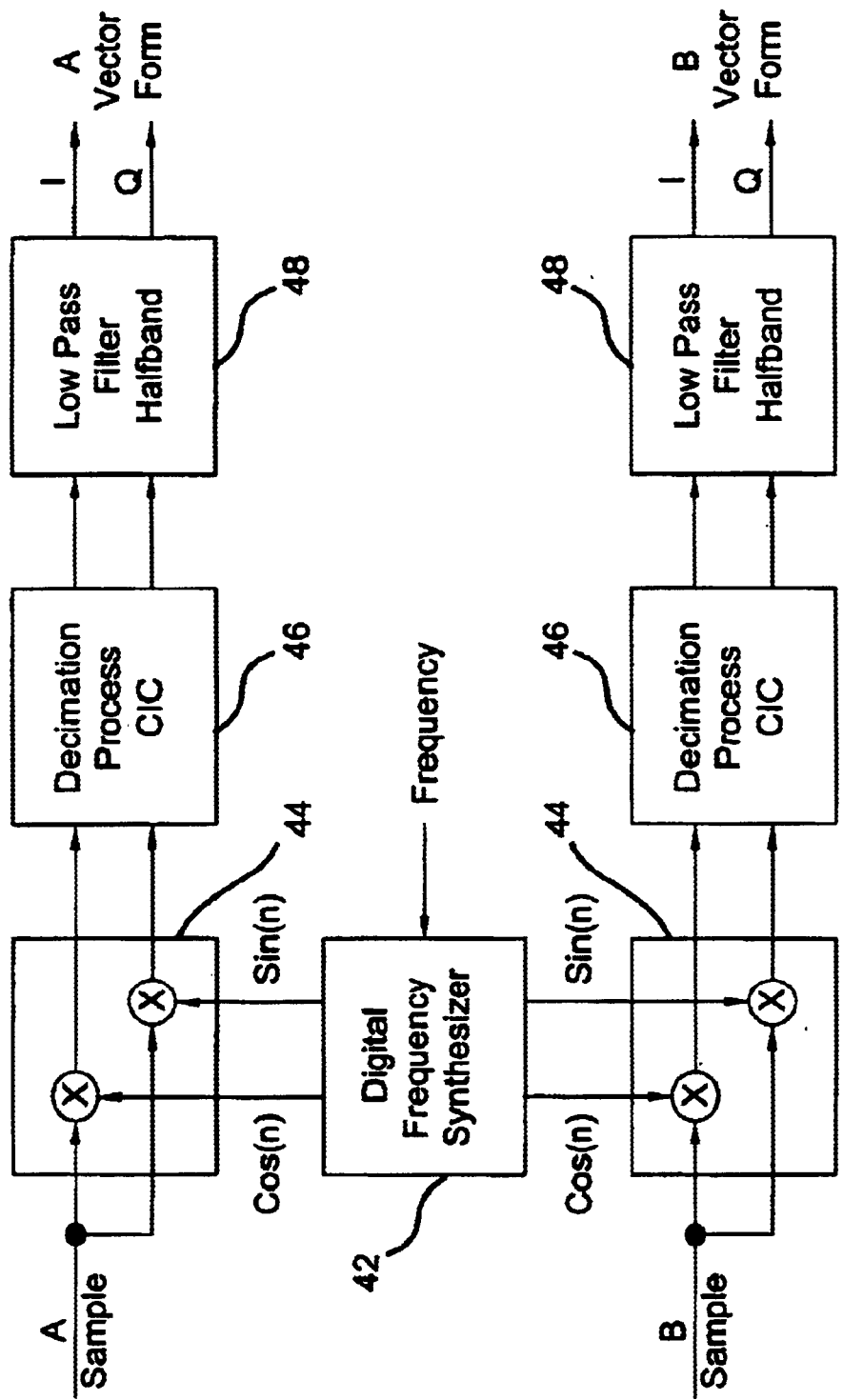
FIG. 3 is a block diagram illustrating a preferred signal processing technique for the sensor signal processing unit in accordance with the present invention.

In a preferred embodiment, the sensor signal processing unit 26 employs a multirate signal processing technique to achieve effective removal of undesirable frequency components from the frequency of interest as shown in FIG. 3. For instance, in the case of an RF generator having two or more sources, bandwidth of the sensor signal processing unit 26 may be designed to pass a frequency of interest associated with one of the two powers sources and filter spurious frequency components which are caused by intermodulation of the power signals from the two sources. The multirate signal processing is preferably implemented in the digital domain using a digital frequency synthesizer 42, a pair of digital mixing modules 44, a pair of decimation modules 46, and a pair of low pass filters 48.

Digital signals acquired from the A/D converter, pair 34 are applied to a pair of digital mixing modules 44. Each digital mixing module 44 also receives two inputs from the digital frequency synthesizer 42. In general, the digital frequency synthesizer 42 generates digital mixing signals. In particular, the digital frequency synthesizer produces a sine and cosine waveform representative of the frequency setpoint, where the frequency setpoint correlates to the frequency of interest. In one embodiment, the frequency setpoint is a frequency offset received from the frequency source, that drives the RF power source. Thus, the frequency tracking technique is coherent. It is readily understood that other coherent frequency tracking techniques as well as various autonomous frequency tracking techniques are within the scope of the present invention.

Each digital mixing module 44 is operable to combine digital mixing signals received from the digital frequency synthesizer 42 with the digital power signals received from the A/D converter pair 34. To do so, each digital mixing module includes two digital multipliers. In addition, the digital mixing modules 44 operates at the sample rate as the A/D converter pair 34. The result from each digital mixing module 44 is a spectrum constructed from the sum and difference of the frequencies contained in the sampled input signals and the signals provided by the digital frequency synthesizer.

Figure 4:
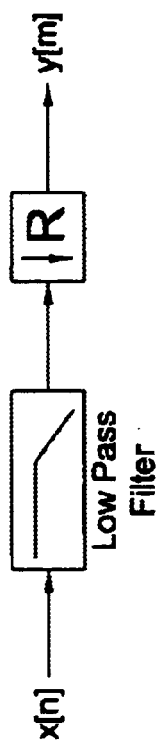
FIG. 4 is a block diagram of a conventional decimator scheme which may be used to implement the decimation process in the sensor signal processing unit of the present invention.

Translation of the sample rate to a manageable data rate occurs in the decimation modules 46. Decimation is a well known process for decreasing the data rate of a signal. A conventional decimator scheme is depicted in FIG. 4.

Although this is an acceptable method for decimation, this scheme embodies various constraints that make it difficult to implement. These constraints include the number of high speed multipliers is equal to the order of the low pass filter, storage requirements for the filter coefficients, and local timing is critical for the low pass filter implementation.

Figure 5:
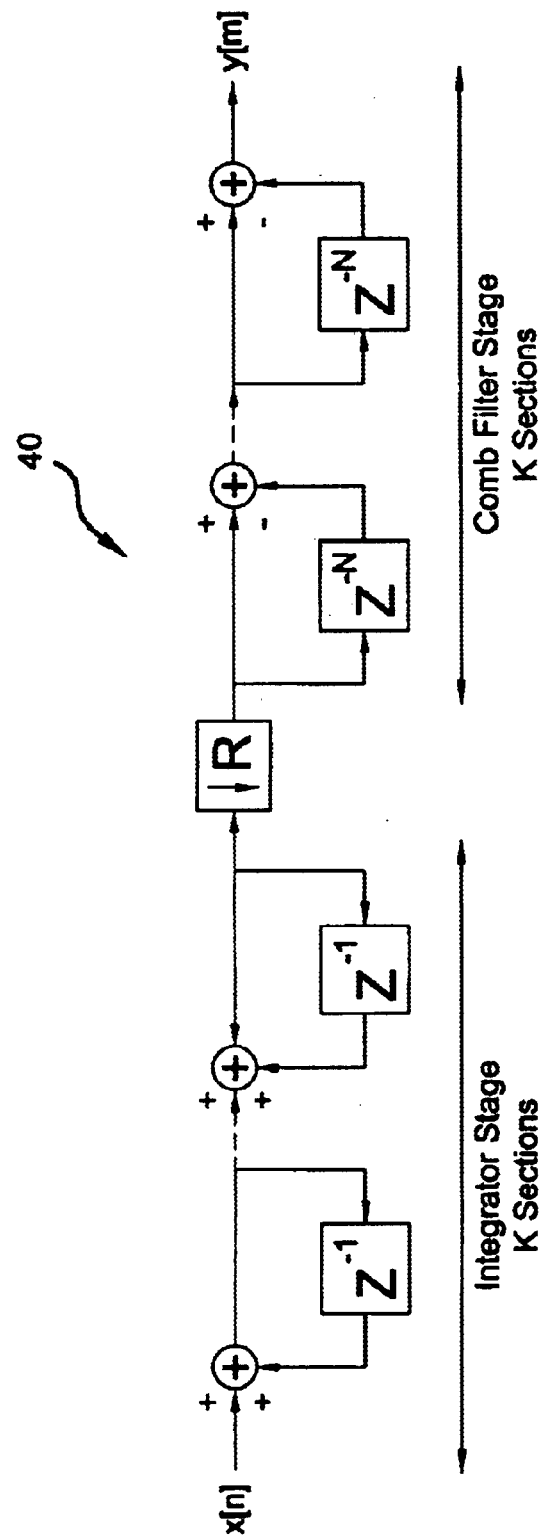
FIG. 5 is a block diagram of a cascaded integrator comb filter which may be used to implement the decimation process in the sensor signal processing unit of the present invention.
Figure 6:
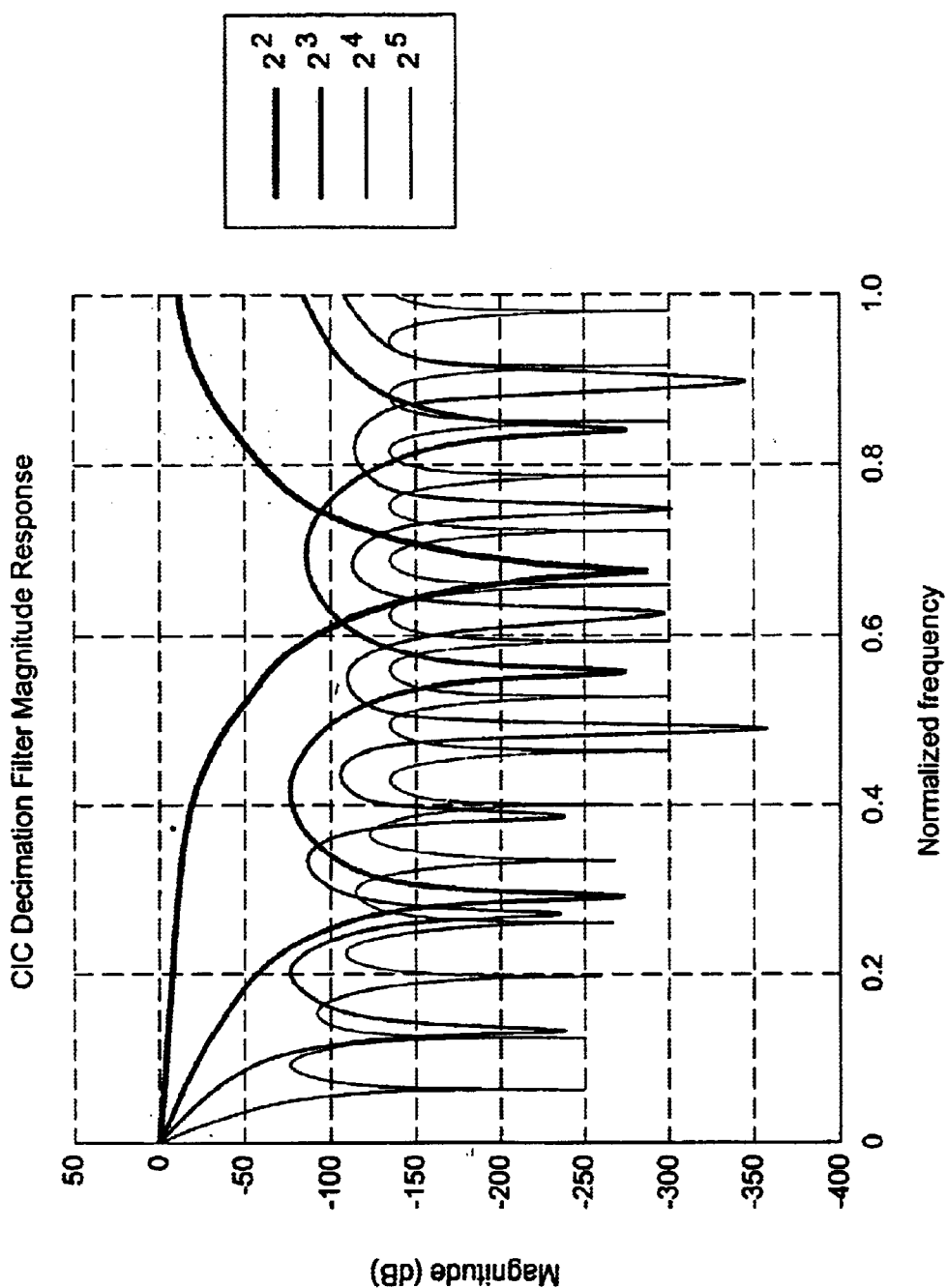
FIG. 6 is a diagram illustrating the frequency response of the cascaded integrator comb filter for various decimation factors.

An alternative decimation scheme is depicted in FIG. 5. In particular, decimation is achieved via a cascade integrator comb (CIC) filter 40. The frequency response of the CIC filter 40 is dependent on the design parameters K, N and R. K yields the number of stages for the filter. The filter is preferably symmetrical such that for a given K there are K integrator stages and K comb filter stages. N is the delay element in the feedback of the comb filter. R is the decimation factor. For a given R, the sample rate is reduced to a data rate of (sample rate/R). For illustration purposes, a plot of the frequency response for various decimation factors for a 5th order CIC filter, where the delay element N is 1, is shown in FIG. 6. As the decimation factor increases, the data rate is proportionally reduced and bandlimiting increased. One skilled in the art will readily recognize that other decimation schemes (e.g., polyphase decomposition) are also within the scope of the present invention.

Returning to FIG. 3, a pair of low pass filters 48 immediately follows the decimation process. The low pass filters provide a shaping function of the spectral output of the CIC filter 40. For example, a nineteen (19) tap halfband filter may be used for this purpose. Output is shown as an in-phase (I) signal and a quadrature (Q) signal for each of the digital power signals input into the sensor signal processing unit 26. It is readily understood that these output signals may serve as control feedback signals for the PR power source 22. It is further understood that other types of control feedback signals may be derived from these output signals and the type of control feedback signal may depend on the type of sensor 24 employed by the RF generator 12.

In the case of autonomous frequency tracking, the frequency setpoint is derived by taking the derivative of output of either sampled input signal with respect to time. The results of this derivative provides the rate of rotation through the complex coordinate system. This rate is directly proportional to the decimated frequency for the difference between the frequency of interest contained in the sampled input signals and the digital frequency synthesizer. As this frequency changes in a RF frequency tune system, the setpoint of the digital frequency synthesizer is adjusted to maintain the frequency of interest in CIC filter passband. The derived frequency could also be a filtered version of the derivatives of each output of either sampled input signal with respect to time. For instance the derivative would be calculated with respect to time for each output signal and then filtered by a linear (average) or nonlinear (median) filter.

The above described signal processing approach may be implemented in a programmable digital signal processor, a programmable device for large scale integration or a combination thereof. The LSI approach is preferable for the speed obtained by parallel processing; whereas the DSP approach is preferred for conversion of data and for applying the appropriate calibration factors.

In sum, the present invention provides an effective and efficient narrow passband filter to eliminate distortion in the measurement of sensor signals. Intermodulation products and environmental noise associated with an RF plasma system are significantly attenuated. The proposed implementation efficiently uses digital logic, thereby leading to a smaller footprint. A comparable analog approach often requires component adjustments and/or different components. The proposed digital implementation will also have minimal long-term drift and is easily adaptable to different applications.

While the invention has been described in its presently preferred form, it will be understood that the invention is capable of modification without departing from the spirit of the invention as set forth in the appended claims.

What is claimed is:

1. An RF generator residing in an RF plasma system, comprising:
    a power source operable to generate RF power signals at a tuned frequency within a tunable frequency range;
    a sensor unit adapted to detect the RF power signals and operable to generate analog signals indicative of the RF power signals, the analog signals having a frequency component of interest related to the tuned frequency of the power source; and
    a sensor signal processing unit adapted to receive the analog signals from the sensor unit and to band limit the analog signals within a predefined bandwidth, wherein the predefined bandwidth of the signal processing unit is adjustable to pass the frequency component of interest and reject interfering frequency components.

2. The RF generator of claim 1 wherein the analog signals is further defined as having a fundamental frequency component and a plurality of spurious frequency components, such that the predefined bandwidth of the signal processing unit is adjustable to pass the fundamental frequency component and filter the plurality of spurious frequency components.

3. The RF generator of claim 1 wherein the predetermined bandwidth of the sensor signal processing unit tracks the tuned frequency of the power source.

4. The RF generator of claim 1 wherein the sensor signal processing unit further includes:
    an A/D converter pair adapted to receive the analog signals from the sensor unit and operable to convert the analog signals to digital power signals; and
    a digital signal processor adapted to receive the digital power signals from the A/D converter pair and operable to derive digital control signals from the digital power signals that track RF power signals generated by an RF generator.

5. The RF generator of claim 4 wherein the sensor unit generates an analog voltage signal indicative of RF line voltage and an analog current signal indicative of RF line current; such that the A/D converter pair converts the analog voltage signal to a digital voltage signal and the analog current signal to a digital current signal.

6. The RF generator of claim 5 wherein the digital signal processor generates an in phase signal and a quadrature signal for each of the digital voltage signal and the digital current signal.

7. The RF generator of claim 4 wherein the digital signal processor further comprises
    a digital frequency synthesizer operable to generate digital mixing signals;
    a first processing component for the processing a first digital power signal; and
    a second processing component for processing a second digital power signal, such that each processing component includes
        a digital complex mixer adapted to receive the digital mixing signals and one of the digital power signals and operable to combine the digital mixing signals with the one digital power signal to form complex coordinates signals;

a decimation module adapted to receive the complex coordinates signals and operable to reduce a data rate of the complex coordinates signals; and a low pass filter adapted to receive the down converted complex coordinates signals from the decimation module and to shape frequency response of the down converted complex coordinates signals.

8. The RF generator of claim 7 wherein the decimation module is further defined as a cascade integrator comb filter.

9. The RF generator of claim 7 wherein the digital mixing signals of the digital frequency synthesizer correlate to the tuned frequency of the power source.

10. The RF generator of claim 5 wherein the digital signal processor is at least partially implemented in a field programmable gate array.

11. An RF plasma system, comprising:

a plasma chamber;

an RF generator that deliver RF power, signals to the plasma chamber; and a matching network interposed between the RF generator and the plasma chamber to match impedances between the RF generator and the plasma chamber, wherein the RF generator further includes a tunable power source operable to generate RF power signals at a tuned frequency within a tunable frequency range;

a sensor unit adapted to detect the RF power signals and operable to generate analog signals indicative of the RF power signals, the analog signals having a fundamental frequency component and a plurality of interfering frequency components; and a sensor signal processing unit adapted to receive the analog signals from the sensor unit and to band limit the analog signals within a predefined bandwidth, wherein the predefined bandwidth of the signal processing unit is adjustable to pass the fundamental frequency component and reject interfering frequency components.

12. An RF generator residing in an RF plasma system, comprising:

a first power source operable to generate RF power signals at a first fixed frequency;

a second power source operable to generate RF power signals at a second fixed frequency;

a sensor unit adapted to detect the RF power signals generated by one of the first and second power sources and operable to generate analog signals indicative of the RF power signals, the analog signals having a frequency of interest related to the fixed frequency of the power source and a plurality of interfering frequency components; and a sensor signal processing unit being implemented in a digital domain, the sensor signal processing unit adapted to receive the analog signals from the sensor unit and to band limit the analog signals within a predefined bandwidth that passes the frequency of interest and rejects interfering frequency components.

13. The RF generator of claim 12 wherein at least some of the plurality of spurious frequency components are caused by intermodulation of the RF power signals from the first and second power source.

14. The RF generator of claim 12 wherein the sensor signal processing unit further includes:

an A/D converter pair adapted to receive the analog signals from the sensor unit and operable to convert the analog signals to digital power signals; and a digital signal processor adapted to receive the digital power signals from the A/D converter pair and operable to derive digital control signals from the digital power signals that track RF power signals generated by an RF generator.

15. The RF generator of claim 14 wherein the sensor unit generates an analog voltage signal indicative of RF line voltage and an analog current signal indicative of RF line current; such that the A/D converter pair converts the analog voltage signal to a digital voltage signal and the analog current signal to a digital current signal.

16. The RF generator of claim 15 wherein the digital signal processor generates an in phase signal and a quadrature signal for each of the digital voltage signal and the digital current signal.

17. The RF generator of claim 14 wherein the digital signal processor further comprises:

a digital frequency synthesizer operable to generate digital mixing signals;

a first processing component for the processing a first digital power signal; and a second processing component for processing a second digital power signal, such that each processing component includes:

a digital complex mixer adapted to receive the digital mixing signals and one of the digital power signals and operable to combine the digital mixing signals with the one digital power signal to form complex coordinates signals;

a decimation module adapted to receive the complex coordinates signals and operable to reduce the data rate of the complex coordinates signals; and a low pass filter adapted to receive the down converted complex coordinates signals from the decimation module and to shape frequency response of the down converted complex coordinates signals.

18. The RF generator of claim 17 wherein the decimation module is further defined as a cascade integrator comb filter.

19. The RF generator of claim 17 wherein the digital mixing signals of the digital frequency synthesizer correlate to the tuned frequency of the power source.

20. The RF generator of claim 14 wherein the digital signal processor is at least partially implemented in a field programmable gate array.

21. A method for generating digital control signals that track radio frequency (RF) power signals generated by an RF generator, comprising:

generating analog signals indicative of the RF power signals generated by the RF generator, the analog signals having a frequency of interest that is related to a tuned frequency of the RF generator;

converting the analog signals into digital power signals;

generating digital mixing signals in accordance with a frequency setpoint;

combining the digital mixing signals with the digital power signals to form digital complex coordinates signals;

reducing a data rate associated with the digital complex coordinate signals; and shaping frequency response of the digital complex coordinate signals, thereby deriving digital control signals that track RF power signals generated by an RF generator.

22. The method of claim 21 wherein the step of generating digital mixing signals further comprises correlating the frequency setpoint to the tuned frequency of the RF generator.

* * * * *